United States Patent [19]

Tsutsui

[11] Patent Number: 4,985,645
[45] Date of Patent: Jan. 15, 1991

[54] BICMOS LOGIC CIRCUIT HAVING A RAPID OUTPUT VOLTAGE FALLING-DOWN PROPERTY

[75] Inventor: Hiroaki Tsutsui, Tokyo, Japan

[73] Assignee: NEC Corporation, Tokyo, Japan

[21] Appl. No.: 412,814

[22] Filed: Sep. 26, 1989

[30] Foreign Application Priority Data

Sep. 26, 1988 [JP] Japan ............................ 63-240176

[51] Int. Cl.⁵ .................. H03K 19/017; H03K 17/04; H03K 19/092; H03K 17/12
[52] U.S. Cl. ................................ 307/446; 307/570; 307/451; 307/443
[58] Field of Search ............... 307/446, 570, 475, 450, 307/451, 279, 270, 448

[56] References Cited

U.S. PATENT DOCUMENTS

| | | | |
|---|---|---|---|
| 4,638,186 | 1/1987 | McLaughlin | 307/446 |
| 4,649,294 | 3/1987 | McLaughlin | 307/443 X |
| 4,694,202 | 9/1987 | Iwamura et al. | 307/446 X |
| 4,694,203 | 9/1987 | Uragami et al. | 307/446 |
| 4,769,561 | 9/1988 | Iwamura et al. | 307/446 |
| 4,779,014 | 10/1988 | Masuoka et al. | 307/446 |
| 4,806,797 | 2/1989 | Yamazaki | 307/443 X |
| 4,902,914 | 2/1990 | Masuoka | 307/446 |

Primary Examiner—Stanley D. Miller
Assistant Examiner—David R. Bertelson
Attorney, Agent, or Firm—Helfgott & Karas

[57] ABSTRACT

A BiCMOS logic circuit includes a MOS logic circuit connected between a high voltage supply line and a low voltage supply line and having an input connected to an input terminal, and an output circuit composed of first and second bipolar transistors connected in series between the high and low voltage supply lines. The first bipolar transistor has a base connected to an output of the MOS logic circuit, and a connection node of the first and second bipolar transistors is connected to an output terminal. In addition, a base current supplying circuit having first and second MOS transistors is connected in series between the first voltage supply line and a base of the second bipolar transistor. The first MOS transistor has a gate connected to the output of the MOS logic circuit, and the second MOS transistor has a gate connected to the input terminal.

10 Claims, 3 Drawing Sheets

4,985,645

BICMOS LOGIC CIRCUIT HAVING A RAPID OUTPUT VOLTAGE FALLING-DOWN PROPERTY

BACKGROUND OF THE INVENTION

1. Field of the Invention

The present invention relates to a BiCMOS logic circuit, and more specifically to a BiCMOS logic circuit having a high operation speed.

2. Description of Related Art

In general, BiCMOS logic circuits have been composed of an input MOS logic circuit and an output bipolar circuit. Conventionally, when electric charges on an output of the bipolar circuit is discharged to pull down an output voltage of the bipolar circuit, a base current for a bipolar transistor for extracting the electric charge on the output of the bipolar circuit is supplied by only a MOS transistor whose gate is connected to a logic input of the input MOS logic circuit and whose drain-source path is connected between a collector and the base of the charge extracting bipolar transistor. In this arrangement, if the collector-base voltage of the charge extracting bipolar transistor becomes lowered as a result of the discharge of the electric charge on the output of the bipolar circuit, the drain-source voltage of the base current supplying MOS transistor is correspondingly decreased, so that the MOS transistor will become to operate in a linear region. As a result, a sufficient base current is not supplied to the charge extracting bipolar transistor, so that the voltage falling down speed of the output of the bipolar circuit becomes small. Thus, the BiCMOS logic circuit has a large delay time, and a long signal propagation time.

SUMMARY OF THE INVENTION

Accordingly, it is an object of the present invention to provide a BiCMOS logic circuit which has overcome the above mentioned defect of the conventional one.

Another object of the present invention is to provide a BiCMOS logic circuit has a shortened signal propagation time when an output voltage falls down.

The above and other objects of the present invention are achieved in accordance with the present invention by a BiCMOS logic circuit which includes an input terminal, an output terminal, a MOS logic circuit connected between a first voltage supply line and a second voltage supply line and having an input connected to the input terminal, and an output circuit composed of first and second bipolar transistors connected in series between the first voltage supply line and the second voltage supply line, the first bipolar transistor having a base connected to an output of the MOS logic circuit, a connection node of the first and second bipolar transistors being connected to the output terminal, comprising a base current supplying circuit having first and second MOS transistors connected in series between the first voltage supply line and a base of the second bipolar transistor, the first MOS transistor having a gate connected to the output of the MOS logic circuit, the second MOS transistor having a gate connected to the input terminal.

The above and other objects, features and advantages of the present invention will be apparent from the following description of preferred embodiments of the invention with reference to the accompanying drawings.

DESCRIPTION OF THE PREFERRED EMBODIMENTS

Figure 1:
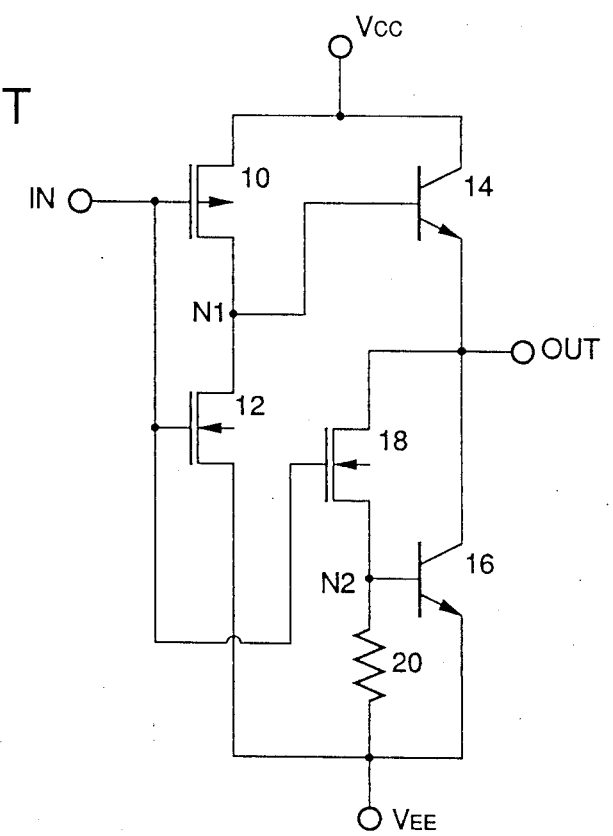
FIG. 1 is a circuit diagram illustrating one example of a conventional BiCMOS logic circuit.

Referring to FIG. 1, there is shown a circuit diagram illustrating one example of a conventional BiCMOS logic circuit. The shown conventional BiCMOS logic circuit comprises a complementary MOS (CMOS) inverter composed of a PMOS transistor 10 and a NMOS transistor 12 connected in series between a high voltage supply line $V_{CC}$ and a low voltage supply line $V_{EE}$. Specifically, a source of the PMOS transistor 10 is connected to the high voltage supply line $V_{CC}$, and a source of the NMOS transistor 12 is connected to the low voltage supply line $V_{EE}$. Gates of these MOS transistors are connected to an input terminal IN. Drains of the PMOS transistor 10 and the NMOS transistor 12 are connected to each other and forms an output node N1 of the CMOS inverter.

The BiCMOS logic circuit also includes a bipolar output circuit composed of two NPN bipolar transistors 14 and 16 connected in series between the high voltage supply line $V_{CC}$ and the low voltage supply line $V_{EE}$. Specifically, the bipolar transistor 14 has a collector connected to the high voltage supply line $V_{CC}$, and an emitter connected to a collector of the bipolar transistor 16, whose emitter is connected to the low voltage supply line $V_{EE}$. A base of the bipolar transistor 14 connected to the high voltage supply line $V_{CC}$ is connected to the output node N1 of the CMOS inverter. In addition, a NMOS transistor 18 is connected between the collector and a base of the bipolar transistor 16 connected to the low voltage supply line $V_{EE}$ in such a manner that a drain of the NMOS transistor 18 is connected to the collector of the bipolar transistor 16 and a source of the NMOS transistor 18 is connected to the base of the bipolar transistor 16. A gate of the NMOS transistor 18 is connected to the input terminal IN. The base of the bipolar transistor 16 is connected to the low voltage supply line $V_{EE}$ through a resistor 20. The connection node between the two NPN bipolar transistors 14 and 16 is connected to an output terminal OUT of the BiCMOS logic circuit. Furthermore, the base of the bipolar transistor 16 is called a node N2 hereinafter.

With the above mentioned arrangement of BiCMOS logic circuit, when a potential on the output terminal OUT is fallen down, an electric charge on the output terminal OUT is extracted through the bipolar transistor 16 connected to the low voltage supply line $V_{EE}$. In addition, a base current for bringing the transistor 16 conductive is supplied by the NMOS transistor 18 which is connected between the collector and the base of the bipolar transistor 16 and which receives at the base thereof an input signal on the input terminal IN.

Therefore, when the collector-base voltage of the transistor 16 is rendered small as a result of the drop of the voltage on the output terminal OUT, the source-drain voltage of the NMOS transistor 18 is correspondingly rendered small. As a result, the NMOS transistor 18 will operate in a linear operation region, so that the NMOS transistor 18 can no longer supply a sufficient base current to the bipolar transistor 16. Accordingly, the falling speed of the potential of the output terminal OUT becomes low, with the result that the BiCMOS logic circuit has a substantial delay time.

Figure 2:
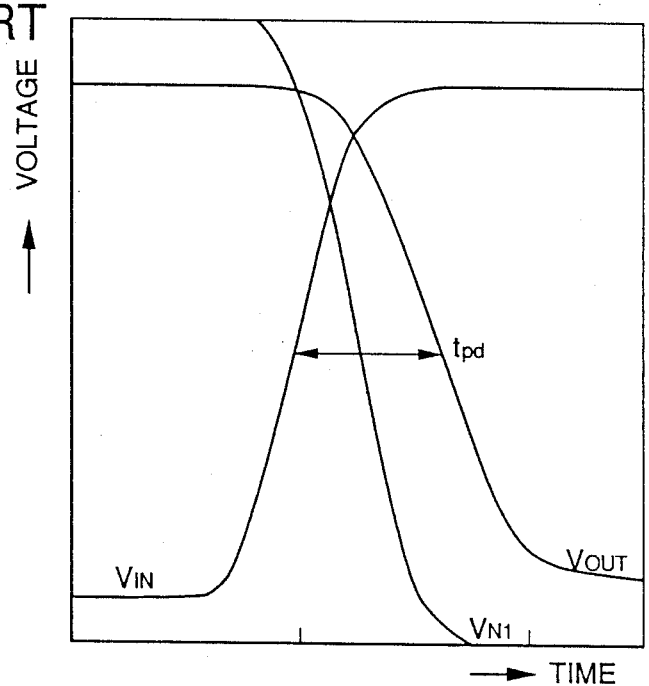
FIG. 2 is a waveform diagram showing voltage variations on various points in the circuit shown in FIG. 1.

This phenomenon will be illustrated in FIG. 2, which shows variations of a voltage $V_{IN}$ on the input terminal IN, a voltage $V_{OUT}$ on the output terminal OUT, and a voltage $V_{N1}$ on the output node N1 of the CMOS inverter. Although the voltage $V_{N1}$ quickly falls down in response to a rising of the voltage $V_{IN}$, the voltage $V_{OUT}$ drops with a delay. Namely, a propagation delay time tpd is large. The reason for this is that a sufficient base current is not supplied to the bipolar transistor 16, and therefore, a collector current of the bipolar transistor 16 is restricted to a low value. For example, assume that a gate width and a gate length of the PMOS transistor 10 and the NMOS transistors 12 and 18 are 20 μm and 1.5 μm, 5 μm and 1.3 μm, and 10 μm and 1.3 μm, respectively, and an emitter area of each of the bipolar transistors 14 and 16 are 7.2 μm². Also assume that the resister 20 has 20KΩ and a supply voltage (between $V_{CC}$ and $V_{EE}$) is 4.5 V. In this case, the delay time tpd becomes 0.63 ns.

Figure 3:
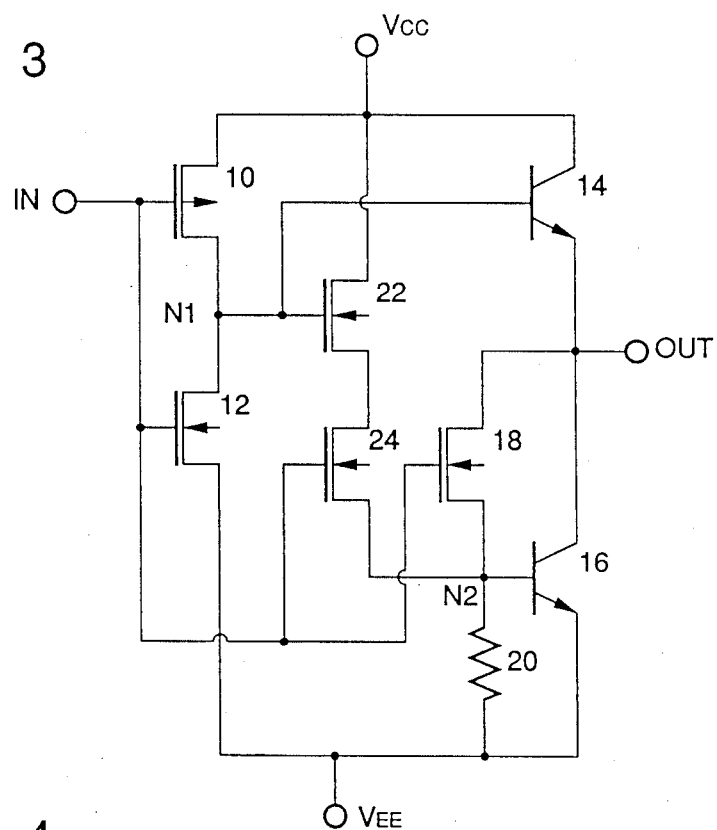
FIG. 3 is a circuit diagram of a first embodiment of the BiCMOS logic circuit in accordance with the present invention.

Referring to FIG. 3, there is shown a circuit diagram of a first embodiment of the BiCMOS logic circuit in accordance with the present invention. In FIG. 3, elements similar to those shown in FIG. 1 are given the same Reference Numerals, and explanation thereof will be omitted for simplification.

As seen from comparison between FIGS. 1 and 3, the circuit shown in FIG. 3 includes a series circuit composed of NMOS transistors 22 and 24 in addition to the circuit shown in FIG. 1. Specifically, the NMOS transistor 22 has a drain connected to the high voltage supply line $V_{CC}$, and a gate connected to the output node N1 of the CMOS inverter. A source of the NMOS transistor 22 is connected to a drain of the NMOS transistor 24, which is connected at a source thereof to the node N2, namely the base of the bipolar transistor 16. A gate of the NMOS transistor 24 is connected to the input terminal 10.

Figure 4:
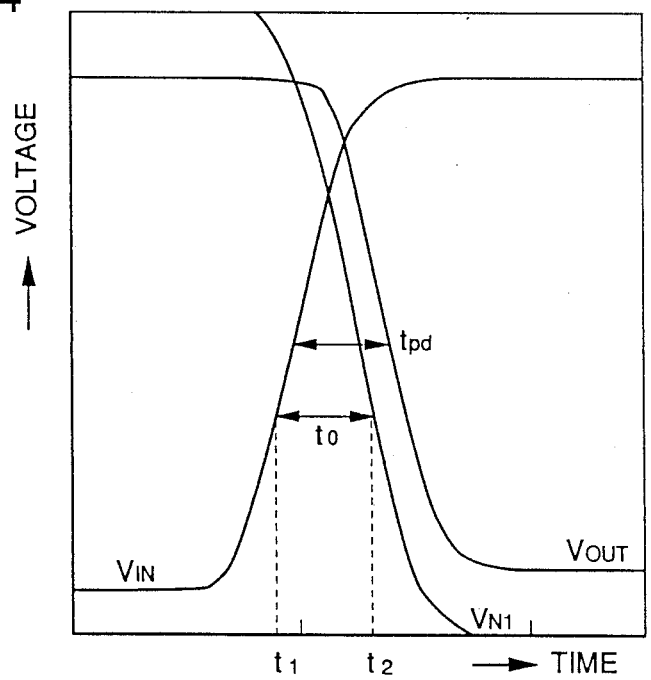
FIG. 4 is a waveform diagram showing voltage variations on various points in the circuit shown in FIG. 3.

Now, an operation of the circuit shown in FIG. 3 will be described with reference to FIG. 4 which illustrates variations of a voltage $V_{IN}$ on the input terminal IN, a voltage $V_{OUT}$ on the output terminal OUT, and a voltage $V_{N1}$ on the output node N1 of the CMOS inverter in the circuit shown in FIG. 3. As shown in FIG. 4, when the input signal voltage $V_{IN}$ on the input terminal IN is brought from a low voltage level to a high voltage level, the voltage $V_{N1}$ on the output node N1 of the CMOS inverter starts to fall down with a short and determined time delay after the moment the input signal V1 starts to rise up. As a result of the rising of the input signal voltage $V_{IN}$, the NMOS transistor 24 is turned on at a moment $t_1$, and thereafter, as a result of the falling of the node voltage $V_{N1}$, the NMOS transistor 22 is turned off at a moment $t_2$. Therefore, for a period of time to from the moment $t_1$ to the moment $t_2$, a current is supplied directly to the base of the bipolar transistor 16 through the two series-connected NMOS transistors 22 and 24 from the high voltage supply line $V_{CC}$, in addition to a conventional base current supply path formed of the transistor 18. Accordingly, the base current of the bipolar transistor 16 is increased, and therefore, the collector current of the bipolar transistor 16 is correspondingly increased. As a result, the speed of extracting the electric charge from the output terminal OUT is increased, and accordingly, the propagation delay time tpd is decreased.

For example, assume that a gate width and a gate length of the PMOS transistor 10 and the NMOS transistors 12, 18, 22 and 24 are 20 μm and 1.5 μm, 5 μm and 1.3 μm, 10 μm and 1.3 μm, 20 μm and 1.3 μm, and 20 μm and 1.3 μm, respectively, and an emitter area of each of the bipolar transistors 14 and 16 are 7.2 μm². Also assume that the resister 20 has 20KΩ and a supply voltage is 4.5 V. In this case, the delay time tpd becomes 0.48 ns, which has been reduced from that of the circuit shown in FIG. 1 by 24%.

Figure 5:
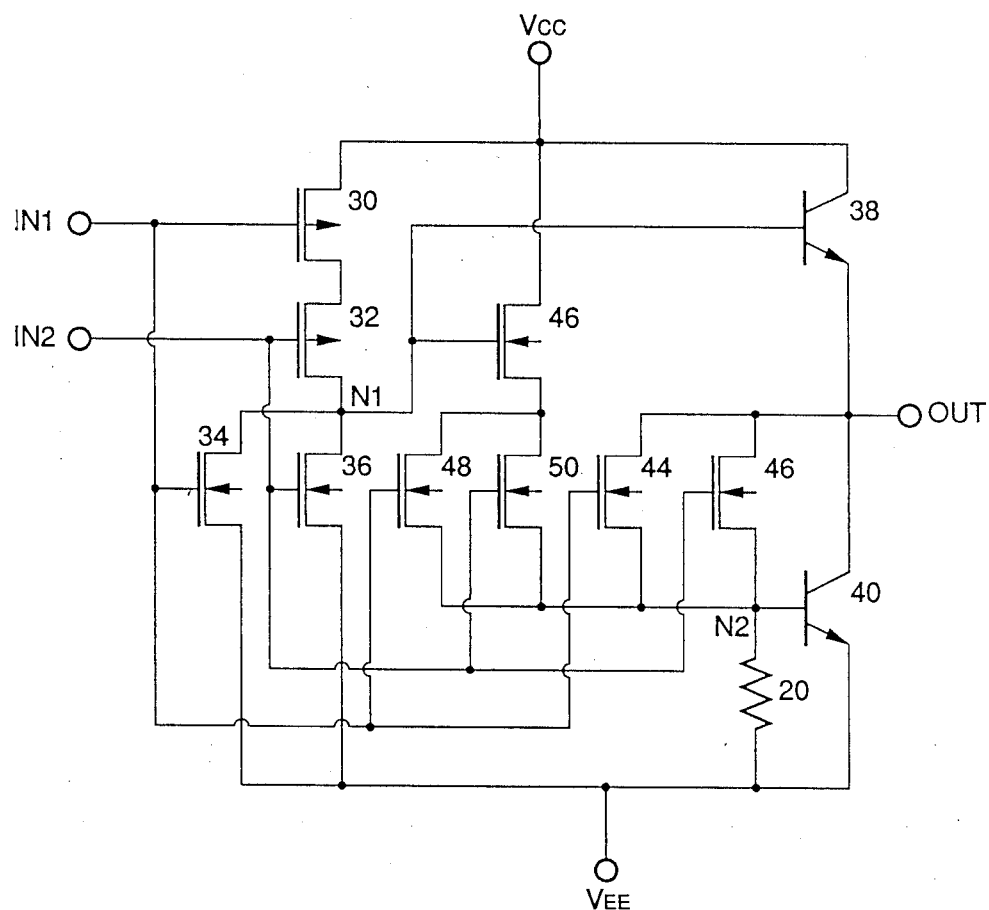
FIG. 5 is a circuit diagram of a second embodiment of the BiCMOS logic circuit in accordance with the present invention.

Turning to FIG. 5, there is shown a circuit diagram of a second embodiment of the BiCMOS logic circuit in accordance with the present invention. This BiCMOS logic circuit forms a two-input NOR circuit.

The shown BiCMOS circuit comprises a two-input CMOS NOR circuit, which includes a first PMOS transistor 30 having a gate connected to a first input terminal IN1 and a source connected to a high voltage supply line $V_{CC}$, and a second PMOS transistor 32 having a gate connected to a second input terminal IN2 and a source connected to a drain of the first PMOS transistor 30. The two-input CMOS NOR circuit also includes a first NMOS transistor 34 having a gate connected to the first input terminal IN1, a drain connected to a drain of the second PMOS transistor 32, and a source connected to a low voltage supply line $V_{EE}$, and a second NMOS transistor 36 having a gate connected to the second input terminal IN2, a drain connected to the drain of the second PMOS transistor 32, and a source connected to the low voltage supply line $V_{EE}$. A connection node N1 between the PMOS transistor 32 and the two NMOS transistors 34 and 36 forms an output node of the CMOS NOR circuit.

The shown BiCMOS circuit further comprises a bipolar output circuit composed of a first NPN bipolar transistor 38 having a collector connected to the high voltage supply line $V_{CC}$ and a base connected to output node N1 of the CMOS NOR circuit, and a second NPN bipolar transistor 40 having a collector connected to an emitter of the NPN bipolar transistor 38 and an emitter connected to the low voltage supply line $V_{EE}$. A base of the second NPN bipolar transistor 40 is connected through a resister 42 to the low voltage supply line $V_{EE}$. In addition, two NMOS transistors 44 and 46 are connected between the collector and the base of the second NPN bipolar transistor 40. A gate of the NMOS transistors 44 is connected to the first input terminal IN1, and a gate of the NMOS transistors 46 is connected to the second input terminal IN2. The connection node between the bipolar transistors 38 and 40 is connected to an output terminal OUT.

The above mentioned construction is similar to conventional two input BiCMOS NOR circuits. In addition to the above mentioned construction, the shown BiCMOS circuit includes a series circuit composed of a NMOS transistor 46 and a parallel circuit of two NMOS transistors 48 and 50, as shown in FIG. 5. The series circuit is connected between the high voltage supply line $V_{CC}$ and the base N2 of the bipolar transistor 40. Specifically, a drain of the NMOS transistor 46 is connected to the high voltage supply line $V_{CC}$ and a gate of the NMOS transistor 46 is connected to the node N1 of the CMOS NOR circuit. A source of the NMOS transistor 46 is connected commonly to drains of the NMOS transistors 48 and 50, whose sources are commonly connected to the base N2 of the bipolar transistor 40. A gate of the NMOS transistor 48 is connected to the first input terminal IN1 and a gate of the NMOS transistor 50 is connected to the second input terminal IN2.

In the above mentioned BiCMOS logic circuit, when the signal voltage $V_{IN1}$ on the first input terminal IN1 (or the signal voltage $V_{IN2}$ on the second input terminal IN2) is brought from a low logical level to a high logical level under a condition that the second input signal voltage $V_{IN2}$ (or the first input signal voltage $V_{IN1}$) is maintained at the low logical level, the NMOS transistor 48 (or 50) is turned on in the course of the rising of the first input signal voltage $V_{IN1}$ (or the second input signal voltage $V_{IN2}$). At this time, since the NMOS transistor 46 is in an ON condition in response to a high logical level on the output node N1 of the CMOS NOR circuit, a current path passing through the NMOS transistor 46 and the NMOS transistor 48 (or 50) is formed to supply an additional base current from the high voltage supply line to the base of the bipolar transistor 40. Namely, the base current of the bipolar transistor 40 is increased. This condition is maintained for a constant period of time until the NMOS transistor 46 is turned off as a result of the voltage falling of the output node N1 of the CMOS NOR circuit. Therefore, a collector current of the bipolar transistor 40 is correspondingly increased, and accordingly, the propagation time tpd is rendered small.

As seen from the above explanation, the BiCMOS logic circuit in accordance with the present invention is characterized by provision of an additional base current supplying circuit connected between a high voltage supply line and a base of a bipolar transistor for extracting electric charges on the output terminal. The additional base current supplying circuit has first and second control inputs connected to an input and an output of a MOS logic circuit, respectively, so that the additional base current supplying circuit operates to supply an additional base current to the base of the electric charge extracting bipolar transistor from the high voltage supply line for a constant time after a logical level on said input terminal starts to change, utilizing the fact that the potential of the output of the MOS logic circuit will change with a little but constant delay from a voltage change of the input of the MOS logic circuit. A a result, the signal propagation time of the BiCMOS logic circuit when the output terminal potential is fallen down can be made small.

The above mentioned embodiments has been directed to the inverter and the NOR circuit. However, the circuit in accordance with the present invention can be applied to the other BiCMOS logic circuits including an AND circuit, an OR circuit, an NAND circuit, etc.

The invention has thus been shown and described with reference to the specific embodiments. However, it should be noted that the present invention is in no way limited to the details of the illustrated structures but changes and modifications may be made within the scope of the appended claims.

I claim:

1. A BiCMOS logic circuit which includes an input terminal, an output terminal, a MOS logic circuit connected between a first voltage supply line and a second voltage supply line and having an input connected to the input terminal, and an output circuit composed of first and second bipolar transistors connected in series between the first voltage supply line and the second voltage supply line, the first bipolar transistor having a base connected to an output of the MOS logic circuit, a connection node of the first and second bipolar transistors being connected to the output terminal, comprising a base current supplying circuit having first and second MOS transistors connected in series between said first voltage supply line and a base of said second bipolar transistor, said first MOS transistor having a gate connected to said output of said MOS logic circuit, said second MOS transistor having a gate connected to said input terminal.

2. A BiCMOS logic circuit claimed in claim 1 further including a third MOS transistor connected between said base of said second bipolar transistor and said connection node of said first and second bipolar transistor and having a gate connected to said input terminal, said base of the second bipolar transistor being connected through a resistor to said second voltage supply line.

3. A BiCMOS logic circuit claimed in claim 1 wherein said MOS logic circuit is a CMOS inverter.

4. A BiCMOS logic circuit claimed in claim 3 wherein said CMOS inverter includes a PMOS transistor having a source connected to the first voltage supply line and a gate connected to said input terminal, and a NMOS transistor having a source connected to the second voltage supply line and a gate connected to said input terminal, drains of said PMOS transistor and said NMOS transistor being connected to each other to form an output of said CMOS inverter.

5. A BiCMOS logic circuit claimed in claim 4 further including a third MOS transistor connected between said base of said second bipolar transistor and said connection node of said first and second bipolar transistors and having a gate connected to said input terminal, said base of the second bipolar transistor being connected through a resistor to said second voltage supply line.

6. A BiCMOS logic circuit claimed in claim 1 wherein said MOS logic circuit is a two-input NOR circuit.

7. A BiCMOS logic circuit claimed in claim 6 wherein said two-input NOR circuit includes first and second input terminals, a first PMOS transistor having a source connected to the first voltage supply line and a gate connected to said first input terminal, a second PMOS transistor having a source connected to a drain of said first PMOS transistor and a gate connected to said second input terminal, and first and second NMOS transistors each having a source connected to the second voltage supply line and a drain connected commonly to a drain of said second PMOS transistor, a gate of said first NMOS transistor being connected to said first input terminal, a gate of said second NMOS transistor being connected to said second input terminal, a connection node between said drain of said second PMOS transistor and said commonly connected drains of said first and second NMOS transistors forming an output of said two-input NOR circuit, and wherein said base current supplying circuit further includes a third MOS transistor connected in parallel to said second MOS transistor, the gate of said first MOS transistor being connected to said output of said two-input NOR circuit, the gate of said second MOS transistor being connected to said first input terminal, and a gate of said third MOS transistor being connected to said second input terminal.

8. A BiCMOS logic circuit claimed in claim 7 further including a fourth and fifth MOS transistors connected in parallel between said base of said second bipolar transistor and said connection node of said first and second bipolar transistors, a gate of said fourth MOS transistor being connected to said first input terminal, and a gate of said fifth MOS transistor being connected to said second input terminal, and said base of said second bipolar transistor being connected through a resistor to said second voltage supply line.

9. A BiCMOS logic circuit which includes at least one input terminal, an output terminal, a MOS logic circuit connected between a first voltage supply line and a second voltage supply line and having at least one input connected to said at least one input terminal, and an output circuit composed of first and second bipolar transistors connected in series between said first voltage supply line and said second voltage supply line, said first bipolar transistor having a base connected to an output of said MOS logic circuit, a connection node of said first and second bipolar transistors being connected to said output terminal, and a MOS transistor connected between a base of said second bipolar transistor and said connection node of said first and second bipolar transistors and having a gate connected to said at least one input terminal, said base of the second bipolar transistor being connected through a resistor to said second voltage supply line, comprising an additional base current supplying circuit connected between said first voltage supply line and said base of said second bipolar transistor and having a first control input connected to said at least one input of said MOS logic circuit and a second control input connected to said output of said MOS logic circuit so that said additional base current supplying circuit operates to supply an additional base current to said base of said second bipolar transistor from said first voltage supply line after a level on said at least input of said MOS logic circuit starts to change from a first logical level toward a second logical level until a level on said output of said MOS logic circuit substantially completes its change from one of said first and second logical levels to the other level.

10. A BiCMOS logic circuit which includes at least one input terminal, an output terminal, a MOS logic circuit connected between a first voltage supply line and a second voltage supply line and having at least one input connected to said at least one input terminal, and an output circuit composed of first and second bipolar transistors connected in series between said first voltage supply line and said second voltage supply line, said first bipolar transistor having a base connected to an output of said MOS logic circuit, a connection node of said first and second bipolar transistors being connected to said output terminal, and a MOS transistor connected between a base of said second bipolar transistor and said connection node of said first and second bipolar transistors and having a gate connected to said at least one input terminal, said base of the second bipolar transistor being connected through a resistor to said second voltage supply line, comprising an additional base current supplying circuit connected between said first voltage supply line and said base of said second bipolar transistor and having a first control input connected to said at least one input terminal and a second control input connected to said output of said MOS logic circuit so that said additional base current supplying circuit operates to supply an additional base current to said base of said second bipolar transistor from said first voltage supply line after a level on said at least input terminal starts to change from a first logical level toward a second logical level until a level on said output of said MOS logic circuit substantially completes its change from one of said first and second logical levels to the other level.

* * * * *